United States Patent [19]
Johnson

[11] Patent Number: 5,898,701
[45] Date of Patent: Apr. 27, 1999

[54] METHOD AND APPARATUS FOR TESTING A DEVICE

[75] Inventor: David L. Johnson, Pleasanton, Calif.

[73] Assignee: Cypress Semiconductor Corporation, San Jose, Calif.

[21] Appl. No.: 08/576,451

[22] Filed: Dec. 21, 1995

[51] Int. Cl.[6] .................................................. G01R 31/28
[52] U.S. Cl. ..................................... 371/22.31; 371/22.34
[58] Field of Search ................................ 371/22.3, 21.6, 371/21.2, 22.5, 22.2, 25.1, 22.31, 22.32, 22.34, 22.35, 27.5; 324/73.1, 158.1, 765; 395/183.06, 183.19; 364/489, 490

[56] References Cited

U.S. PATENT DOCUMENTS

| | | | |
|---|---|---|---|
| 4,710,927 | 12/1987 | Miller ........................................ | 371/15 |
| 4,734,852 | 3/1988 | Johnson et al. ......................... | 364/200 |
| 4,872,168 | 10/1989 | Aadsen et al. .......................... | 371/21.3 |
| 4,876,640 | 10/1989 | Shankar et al. ......................... | 364/200 |
| 4,910,664 | 3/1990 | Arizono .................................. | 364/200 |
| 4,929,889 | 5/1990 | Seiler et al. ............................ | 371/22.3 |
| 5,029,133 | 7/1991 | La Fetra et al. .................... | 365/189.02 |
| 5,311,520 | 5/1994 | Raghavachari ......................... | 371/21.6 |
| 5,347,523 | 9/1994 | Khatri et al. ........................... | 371/22.3 |
| 5,412,260 | 5/1995 | Tsui et al. ................................. | 326/39 |
| 5,448,576 | 9/1995 | Russell .................................... | 371/22.3 |
| 5,519,715 | 5/1996 | Hao et al. ............................... | 371/22.3 |
| 5,526,365 | 6/1996 | Whetsel ................................. | 371/22.3 |
| 5,604,756 | 2/1997 | Kawata ................................... | 371/67.1 |
| 5,608,885 | 3/1997 | Gupta et al. ............................. | 395/380 |

OTHER PUBLICATIONS

Cypress Preliminary CY7C371, "32–Macrocell Flash CPLD", 3–99–3–106.

*IEEE Standard Test Access Port and Boundary–Scan Architecture*, Institute of Electrical and Electronics Engineers, Inc., New York, pp. 1:1–5; 2:1–6; 3:1–9; 4:1:1–5; 2:1–6; 3:1–9; 4:1–3; 5:1–16; 6:1–4; 7:1–28; 8:1–7; 9:1–2; 10:1–45; 11:1–5; 12:1–6; A:1–12, (Oct. 1993).

Cypress Semiconductor Corporation, "7C322D/7C22H Programming Specification (Flash 22V10)", pp. 1–48, Document No. 40–00039.

*Primary Examiner*—Robert W. Beausoliel, Jr.
*Assistant Examiner*—Nadeem Iqbal
*Attorney, Agent, or Firm*—Blakely Sokoloff Taylor & Zafman, LLP

[57] ABSTRACT

A novel method and apparatus for testing a device is described. The novel method and apparatus uses a reduced number of method steps, instructions, and clock cycles in order to test a device. In one embodiment of the present invention, a method for testing a device is described in which a device is instructed in one instruction to receive address information and a first data packet. The address information and the first data packet are loaded into the device. The first data packet may be selectively passed through a first storage element into a second storage element, and the address information may be loaded into the first storage element. The device is then instructed to program the first data packet into an address location of said device defined by the address information stored in the device. The device is then instructed to read or capture a second data packet from the address location defined by the address information. The second data packet is then output from the device. The second data packet may then be compared with the first data packet to verify the correct initial programming of the first data packet at the address location in the device. Additionally, the device may be instructed to selectively receive a third data packet and then load the third data packet into the device without overwriting the address information already stored in the device. The first data packet and the address information may be serially shifted into the device or loaded in parallel into the device. In like manner, the second data packet may be serially shifted out of the device or outputted in a parallel manner.

20 Claims, 9 Drawing Sheets

METHOD AND APPARATUS FOR TESTING A DEVICE

BACKGROUND OF THE INVENTION

1. Field of the Invention

The present invention relates to the field of test circuitry for integrated circuits or systems. More particularly, the present invention pertains to a novel method of testing a circuit using a reduced number of method steps, instructions and clock cycles.

2. Art Background

Various techniques have been developed to enable testing of a device, such as an integrated device, by including test logic into the device itself. The integrated test logic provides the ability to test the overall functionality of a particular device as well as a functional block (logic blocks, registers, I/O's etc.) within a particular device. Additionally, integrated test logic provides a way for testing interconnections between integrated circuits once the circuits have been assembled onto a printed circuit board (PCB) or other substrate, as well as, observing and modifying circuit activity during a device's normal operation.

One standardized approach to providing the test logic within a device is defined in IEEE Std 1149.1–1990 and 1149.1a–1993 entitled IEEE Standard Test Access Port and Boundary-Scan Architecture (IEEE Std 1149.1). IEEE Std 1149.1 defines a test access port (TAP) which is a general purpose port that can provide access to many test support functions built into a component to be tested. The TAP has a minimum of three dedicated input connections: a Test Input Clock (TCK) for clocking in serial test data or instruction information, a Test Mode Select Input (TMS) which is decoded by logic accessing the TAP to control test operations, and Test Data Input (TDI) which provides serial input test data or instruction information. In addition, the TAP has at a minimum one dedicated output: Test Data Output (TDO) which provides for the serial output of data from the TAP. Through the use of the test logic accessed through the TAP, data, address and instruction information may be serially written to and read from a device under test.

FIG. 1 shows a single device under test configuration 10 in which test logic accessed through a TAP may be implemented. A device under test 12 may be a single integrated circuit device or a system on a PCB. Device under test 10 includes a test circuit 14 which receives serial test data input TDI 16, test input clock TCK 20, and test mode select TMS 22. Additionally test circuit 14 outputs serial test data output 18.

FIG. 2 shows a multiple devices under test configuration 100 and illustrates how components to be tested may be interconnected in a serial configuration in compliance with IEEE Std 1149.1. Specifically, device under test 102 is serially connected to device under test 104 through their respective test circuits 106 and 108. When test circuits 106 and 108 comprise test logic accessed through a TAP as illustrated in FIG. 2, test circuits 106 and 108 receive TCK 112 and TMS 114. Test data and instruction information is serially received by test circuit 106 from TDI 110 and is output as serial output data at node 118. The serial output data at node 118 is received by test circuit 108 and output as serial output data at TDO 116. Test circuits 106 and 108 may be distributed throughout devices under test 102 and 104.

FIG. 3 illustrates, in accordance with IEEE Std 1149.1, prior art test logic 200 for testing a component and using a TAP. Test logic 200 comprises controller 203 which includes control logic 202 coupled to decode control logic 204. Control logic 202 receives and interprets the signals on TMS 218 and TCK 220 and together with decode control logic 204 generates clock and/or control signals as required. A set of registers, including instruction register 206, data registers 208 and 210, boundary scan register 212 and bypass register 214, are configured to receive input signals from decode control logic 204, TCK 220 and TDI 222.

Through the interaction of control logic 202 and decode control logic 204 an instruction is serially loaded into instruction register 206 from TDI 222. With instruction register 206 comprising Z bits, it requires Z clock cycles of TCK 220 to load an instruction into instruction register 206. Instructions loaded into instruction register 206 are decoded by decode control logic 204 and are used to select a test to be performed and/or register to be accessed. Data register 208 which comprises X bits, and data register 210 which comprises Y bits, allow access to design-specific test support features in a device under test, such as self-test, scan paths, etc. Boundary scan register 212 allows testing of board interconnections, testing of typical production defects such as opens and shorts and allows access to component inputs and outputs. Bypass register 214 provides a one-bit serial connection for use when no other register is being used.

Additionally, test logic 200 includes a selector 216 which is controlled by a select signal at node 226 from decode control logic 204. Selector 216 receives the serially shifted out data from instruction register 206, data registers 208 and 210, boundary scan registers 212 and bypass register 214 and selectively outputs the received data at output TDO 224.

Test logic 200 has been utilized to test a device, such a programmable logic device, as illustrated in FIG. 8. At step 800, an instruction is serially shifted into instruction register 206 which instructs test logic 200 to load address information into data register 208. The address information indicates an address to be tested within the device under test. At step 802, the address information is serially shifted into data register 208. At step 804, an instruction is serially shifted into instruction register 206 which instructs test logic 200 to load data register 210 with a first data packet. At step 806, the first data packet is serially shifted into data register 210. At step 808, an instruction is serially shifted into instruction register 206 which instructs test logic 200 to program the address location stored in data register 208 with the first data packet stored in data register 210. At step 810, an instruction is serially shifted into instruction register 206 which instructs test logic 200 to read or capture a second data packet from the address location stored in data register 208 and store the captured second data packet into data register 210. This step verifies that the first data packet was correctly programmed into the address location stored in data register 208. Finally, at step 812, the data packet stored in data register 210 is serially shifted out from data register 210 through selector 216 to TDO 224.

The method of FIG. 8 requires a significant number of clock cycles in order to program a location in a device under test and to verify that the programming was completed correctly. Specifically, it requires 4Z+2Y+X clock cycles: 4Z clock cycles to load the four instructions in steps 800, 804, 808 and 810; 2Y clock cycles to execute steps 806 and 812; and X clock cycles to execute step 802. The more clock cycles that are used to test a device, the lower the testing throughput and the greater the likelihood that a false programming error will be introduced due to system noise. Additionally, the more instructions that are used in order to test a device, the lower the testing throughput.

Therefore, a need exists for a method of testing a device, which may incorporate test logic compatible with IEEE Std 1149.1, in a reduced number of method steps, reduced number of instructions and reduced number of clock cycles in order to increase testing throughput. Additionally, a need exists for a method of testing a device, which may incorporate test logic compatible with IEEE Std 1149.1, in a reduced number of clock cycles in order to reduce the number of false errors caused due to system noise.

SUMMARY OF THE INVENTION

A novel method and apparatus for testing a device is described. The novel method and apparatus uses a reduced number of method steps, reduced number of instructions, and a reduced number of clock cycles in order to test a device. The novel method may be implemented in an integrated circuit or a plurality of integrated circuits tested in a serial configuration or in a parallel configuration. The novel method and apparatus may also be implemented in a plurality of devices assembled onto a printed circuit board or other substrate. Additionally, the novel method and apparatus may be implemented with test logic compatible with IEEE Std 1149.1 or with test logic compatible with other standards or architectures.

In one embodiment of the present invention, a method for testing a device is described in which a device is instructed in one instruction to receive address information and a first data packet. The address information and the first data packet are loaded into the device. The first data packet may be selectively passed through a first storage element into a second storage element, and the address information may be loaded into the first storage element. The device is then instructed to program the first data packet into an address location of said device defined by the address information stored in the device. The device is then instructed to read or capture a second data packet from the address location defined by the address information. The second data packet is then output from the device. The second data packet may then be compared with the first data packet to verify the correct initial programming of the first data packet at the address location in the device. Additionally, the device may be instructed to selectively receive a third data packet and then load the third data packet into the device without overwriting the address information already stored in the device. It will be appreciated that the first data packet and the address information may be serially shifted into the device or loaded in parallel into the device. In like manner, the second data packet may be serially shifted out of the device or outputted in a parallel manner.

In another embodiment of the present invention, a method for testing a device is described in which a device is instructed in Z clock cycles to receive address information and a first data packet. The device loads the address information in X clock cycles, and loads the first data packet in Y clock cycles. The device is then instructed in Z clock cycles to program the first data packet into an address location of the device defined by the address information. Then, the device is instructed in Z clock cycles to capture a second data packet from the address location. Finally, the device outputs the second data packet from said device in Y clock cycles. The second data packet may then be compared against the first data packet.

A novel apparatus comprising a test circuit is described. The novel test circuit includes control logic for controlling the flow of address information and a first data packet received by the device. The control logic is connected to an address storage element for storing the address information, a data storage element for storing the first data packet, and at least one extra storage element for storing either the address information or the first data packet. The novel test circuit further includes a plurality of multiplexors selectively controlled by the control logic, and interconnected between the address storage element, data storage element, and the at least one extra storage element. The control logic selectively enables the plurality of multiplexors to pass the first data packet through the address storage element and into the data storage element, as well as, enabling the plurality of multiplexors to pass either the address information or the first data packet through the address storage element and the data storage element and into the at least one extra storage element. The novel test circuit enables the first data packet to be programmed into an address location of the device defined by the address information. The data storage element and/or the at least one extra storage element then captures a second data packet from the address location, and the second data packet is output from the device. The second data output from the device may then be compared against the first data packet.

Other features and advantages of the present invention will be apparent from the accompanying drawings and from the detailed description that follows.

BRIEF DESCRIPTION OF THE DRAWINGS

The features and advantages of the present are illustrated by way of example and are by no means intended to limit the scope of the present invention to the particular embodiments shown.

DETAILED DESCRIPTION

A novel method and apparatus for testing a device is disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily. Additionally, the novel method and apparatus is described in relation to, and in compliance with, IEEE Std 1149.1. However, it will be appreciated by one skilled in the art that the present invention may be implemented within any device or system that incorporates test logic utilizing other standardized or non-standardized integrated test logic.

Figure 1:
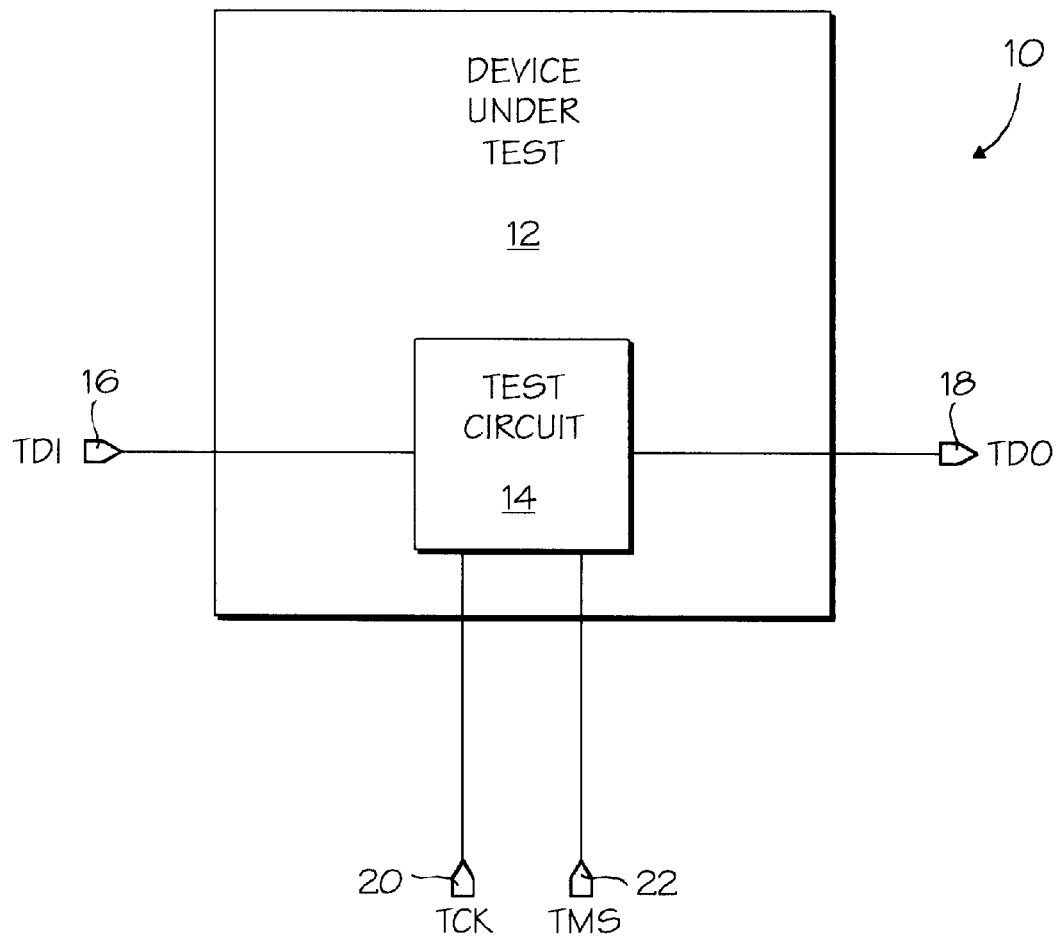
FIG. 1 illustrates a single device under test in which the present invention may be implemented.
Figure 2:
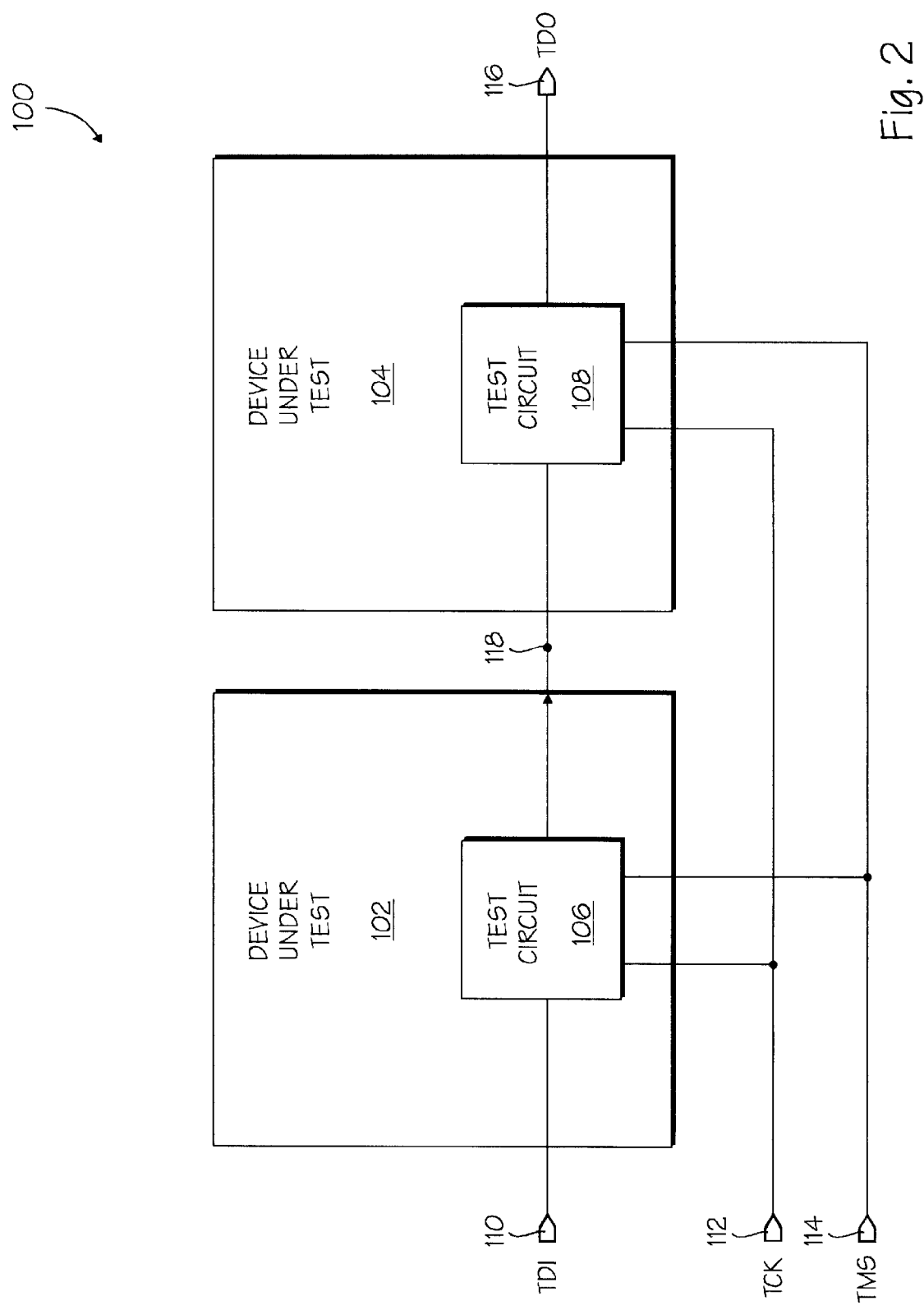
FIG. 2 illustrates multiple devices under test in which the present invention may be implemented.

As previously discussed, the known methods and apparatus for testing a device utilizing test logic compliant with IEEE Std 1149.1 require a significant number of steps, instructions, and clock cycles. The novel method and apparatus of the present invention addresses these problems by utilizing a reduced number of method steps, reduced number of instructions, and a reduced number of clock cycles in order to test a device. The novel method may be implemented in test circuit 14 of an integrated circuit, as illustrated in FIG. 1, in a plurality of integrated circuits tested in a serial configuration as illustrated in FIG. 2, or in a parallel configuration. The novel method and apparatus may also be implemented in a plurality of devices assembled onto a printed circuit board or other substrate. Additionally, the novel method and apparatus may be implemented with test logic compatible with IEEE Std 1149.1 or with test logic compatible with other standards or architectures.

Figure 3:
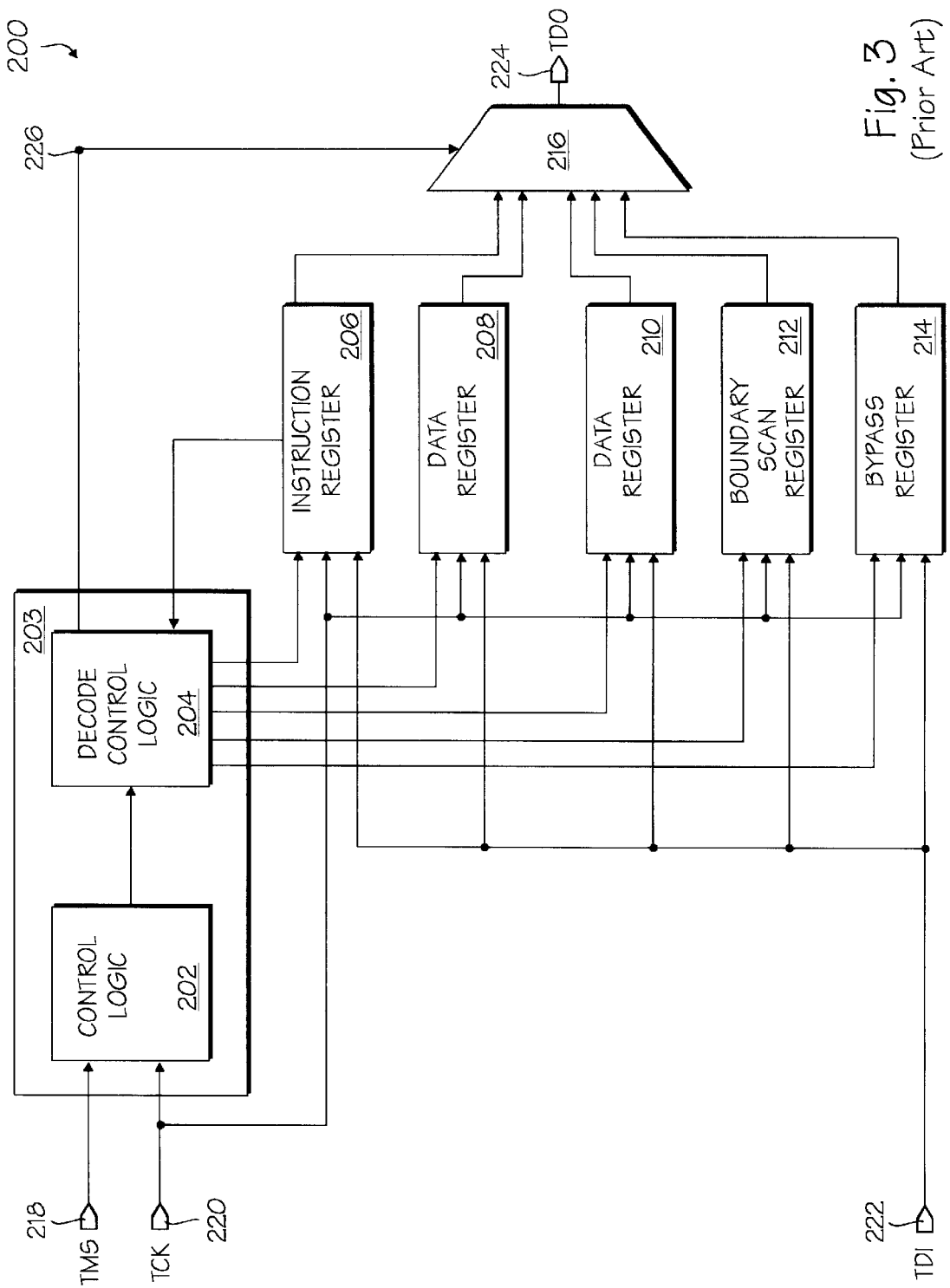
FIG. 3 illustrates an apparatus a prior art embodiment of test circuit.
Figure 4:
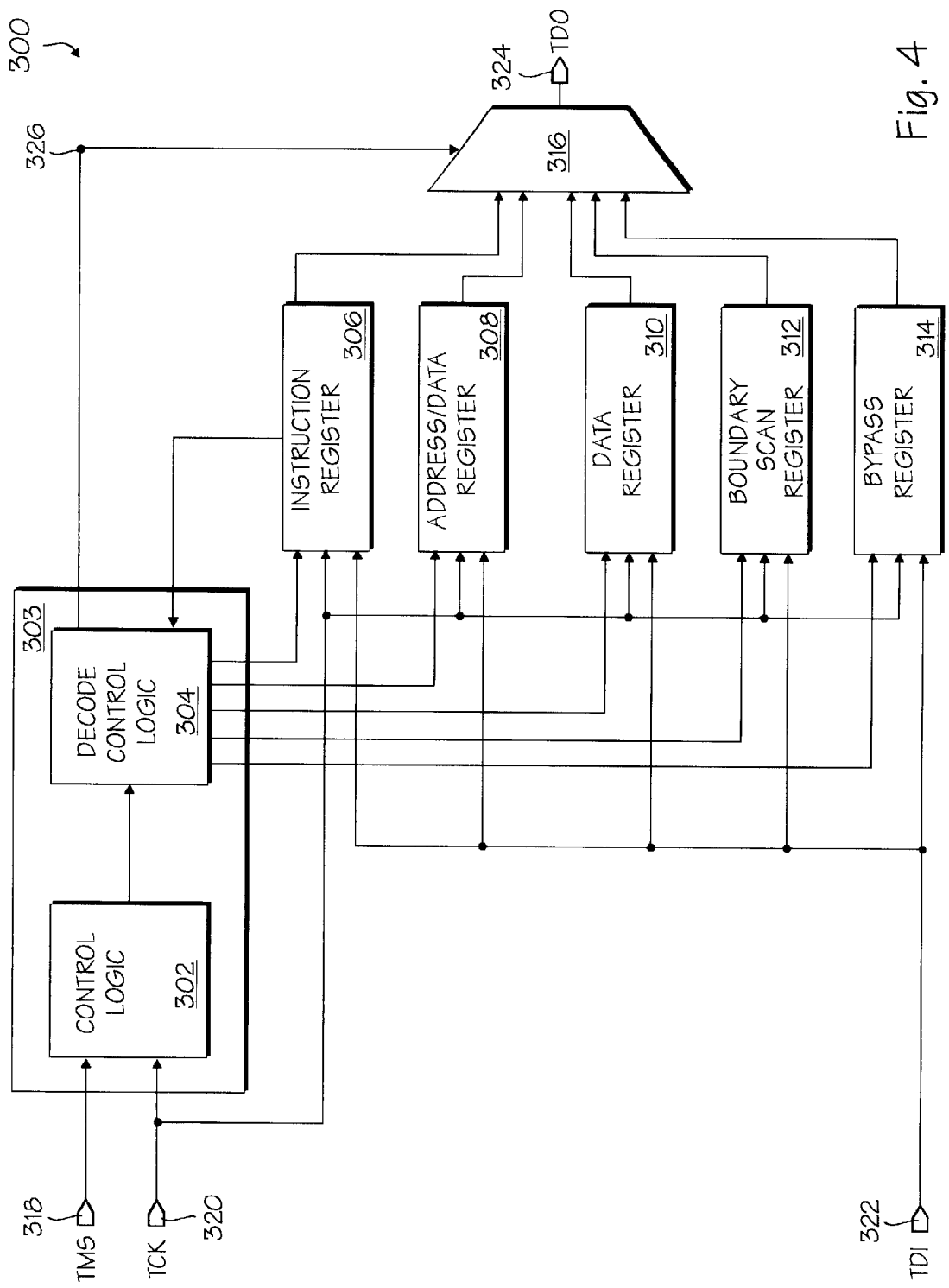
FIG. 4 illustrates a test circuit in which a first embodiment of the present invention may be implemented.

FIG. 4 illustrates test logic 300 in which one embodiment of the present invention may be implemented. Test logic 300 includes a controller 303 which comprises control logic 302 and decode control logic 304. Control logic 302 receives and interprets the signals on TMS 318 and TCK 320 and together with decode control logic 304 generates clock and/or control signals as required. It will be appreciated that control logic 302 and decode control logic 304 may be integrated into one functional block to perform the functions necessitated by controller 303. Test logic 300 further includes instruction register 306, address/data register 308, data register 310, boundary scan register 312 and bypass register 314. Each register is configured to receive input signals from decode control logic 304, TCK 320 and TDI 322. Bypass register 312 and boundary scan register 314 function in a similar manner as bypass register 212 and boundary scan register 214 described with reference to FIG. 3, and are not required in order to practice the present invention.

Additionally, test logic 300 includes selector 316 which is controlled by a select signal at node 326. Selector 316 receives data serially shifted out from instruction register 306, address/data register 308, data register 310, boundary scan register 312 and bypass register 314 and selectively outputs the data at output TDO 324. Selector 316 may comprise, for example, a 5-to-1 multiplexor.

Test logic 300 is similar to test logic 200 illustrated in FIG. 3. Through the interaction of control logic 302 and decode control logic 304 an instruction is serially loaded into instruction register 306 from TDI 322. With instruction register 306 comprising Z bits, it requires Z clock cycles of TCK 320 to load an instruction into instruction register 306. Instructions loaded into instruction register 306 are decoded by decode control logic 304 and are used to select a test to be performed and/or register to be accessed. Data register 310, which comprises Y bits, and address/data register 308 allow access to design-specific test support features in a device under test, such as self-test, scan paths, etc. Data register 208 in FIG. 3 which comprised X bits and was utilized in the method described in FIG. 8 to store address information, has been replaced in test logic 300 of FIG. 4 with address/data register 308 which comprises X+Y bits and is used to store both address information and data information. Configuring address/data register 308 as illustrated in FIG. 4 enables the method of the present invention to use a reduced number of method steps, instructions and clock cycles as illustrated in FIG. 9.

Figure 9:
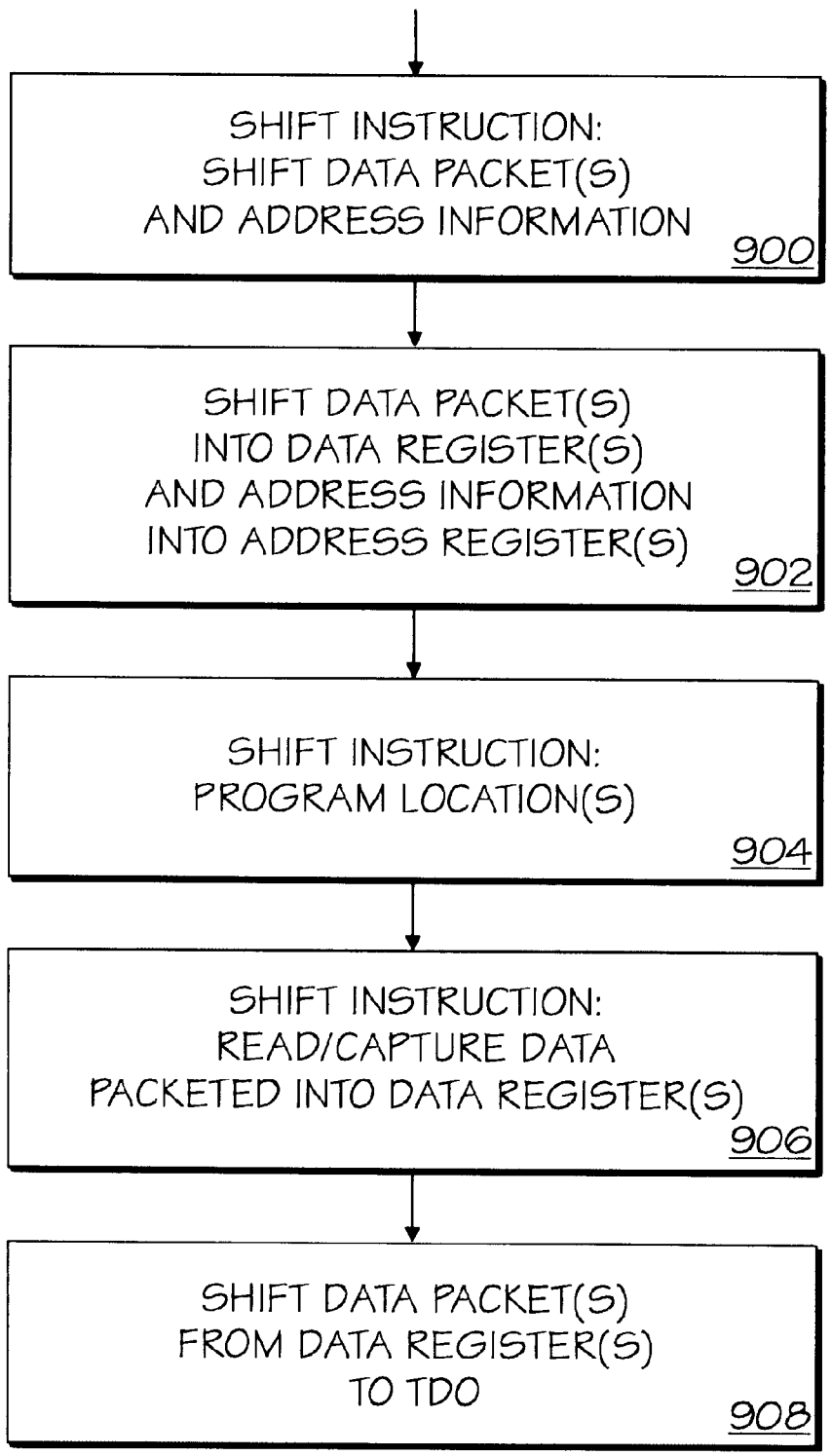
FIG. 9 illustrates a method corresponding to the first and second embodiments of the present invention.

FIG. 9 illustrates a novel method for testing a device. At step 900, an instruction is serially shifted into instruction register 306 which instructs test logic 300 in one instruction to load address/data register 308 with address information and a first packet of data. At step 902, the first data packet is serially shifted into address/data register 308, and address information is also serially shifted into address/data register 308. At step 904, an instruction is serially shifted into instruction register 306 which instructs test logic 300 to program the first data packet stored in address/data register 308 into an address location of the device under test defined by the address information also stored in address/data register 308. At step 906, an instruction is serially shifted into instruction register 306 which instruct test logic 300 to read or capture a second data packet from the address location defined by the address information stored in address/data register 308, and store the second data packet into data register 310. This step verifies that the first data packet was correctly programmed into the address location stored in address/data register 308. At step 908, the second data packet stored in data register 310 is serially shifted out of data register 310, through selector 316 and to TDO 324.

Once the second data packet has been serially shifted out of test logic 300 through TDO 324, it may be compared with the first data packet in order to verify that the first data packet was correctly programmed into the address location defined by the address information stored in address/data register 308.

Figure 8:
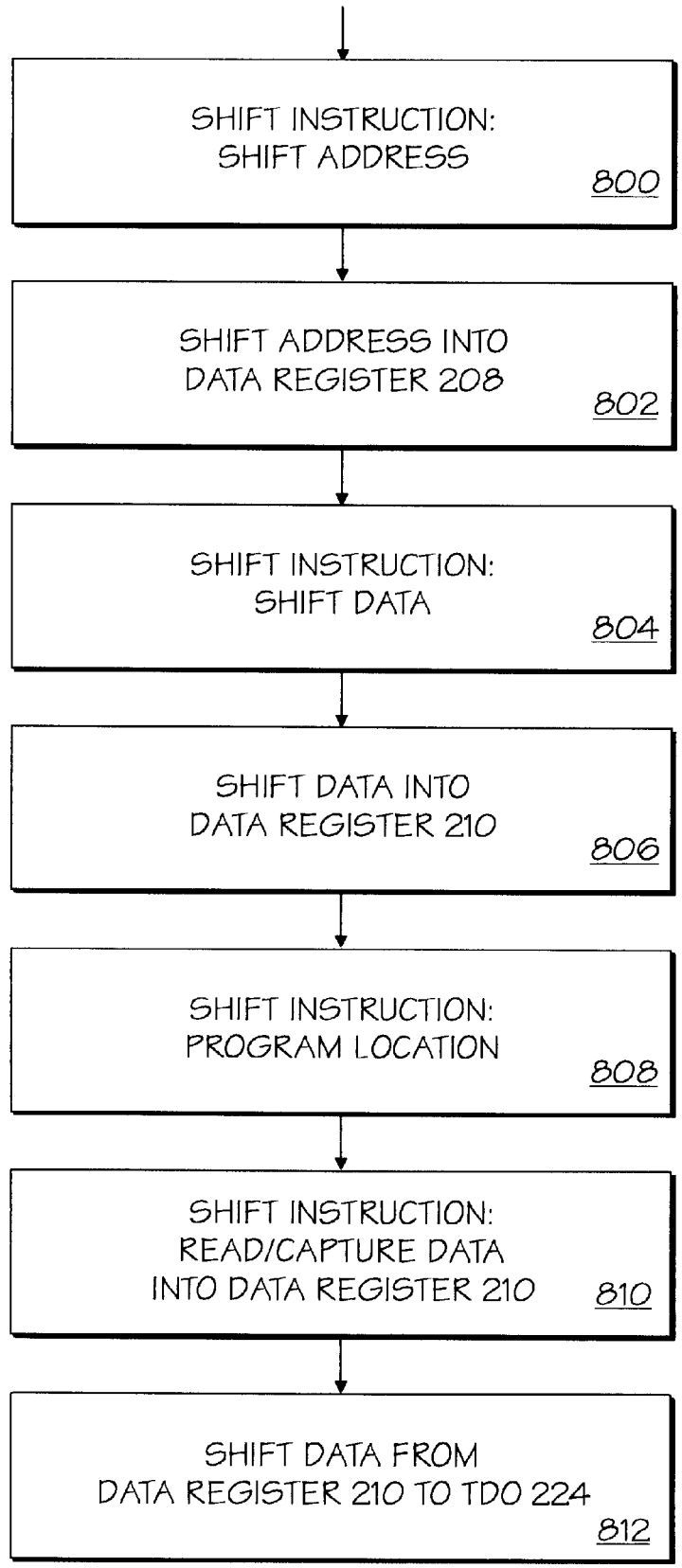
FIG. 8 illustrates a prior art method for testing a device.

The novel method described in FIG. 9 illustrates that a device can be tested using only five method steps rather than seven method steps as utilized in the prior method illustrated in FIG. 8. Additionally, the method described in FIG. 9 requires that only three instructions be loaded into instruction register 308, whereas the prior method illustrated in FIG. 8 requires four instructions. Significantly, the method described in FIG. 9 requires only a total of 3Z+2Y+X clock cycles in order to perform the testing of a device, namely: 3Z clock cycles to load the three instructions in steps 900, 904 and 906; 2Y clock cycles to execute part of step 902 and step 908; and X clock cycles to execute part of step 902. This is an appreciable reduction of Z clock cycles over the method illustrated in FIG. 8, and thus increases the testing throughput of the device or system, and decreases the likelihood of false errors occurring during the testing process due to undesired influences from system noise.

The method of testing of device described in FIG. 9 has been illustrated above with the serial shifting of data and address information into and out of the various components of the device under test. The present invention may be implemented, however, in test logic 300 and employing the method of FIG. 9, by loading data in parallel and reading data out from the device under test in parallel. In a parallel configuration, TDI 322 would comprise a parallel bus of any size, and would load data in parallel to registers 306, 308, 310, 312 and 314. Data could also be outputted in parallel through selector 316 and out to TDO 324. In a parallel configuration, address/data register 308 and data register 310 may comprise memory blocks such as FIFO's or other conventional memory. Alternatively, any combination of serial and parallel architectures could be implemented by one skilled in the art within the scope and spirit of the present described invention.

Test logic 300 stores the second data packet, which is captured from the address location programmed in the device under test, into data register 310. Test logic 300 can be designed to implement the method of FIG. 9 so that the second data packet is captured into address/data register 308, thus obviating the need for data register 310. However, if a second programming is initiated in order to verify or reprogram a part of the device under test, the entire address/data register 308 would have to be reloaded with the address information and a third data packet. Thus, the entire method of FIG. 9 would have to be repeated.

Figure 5:
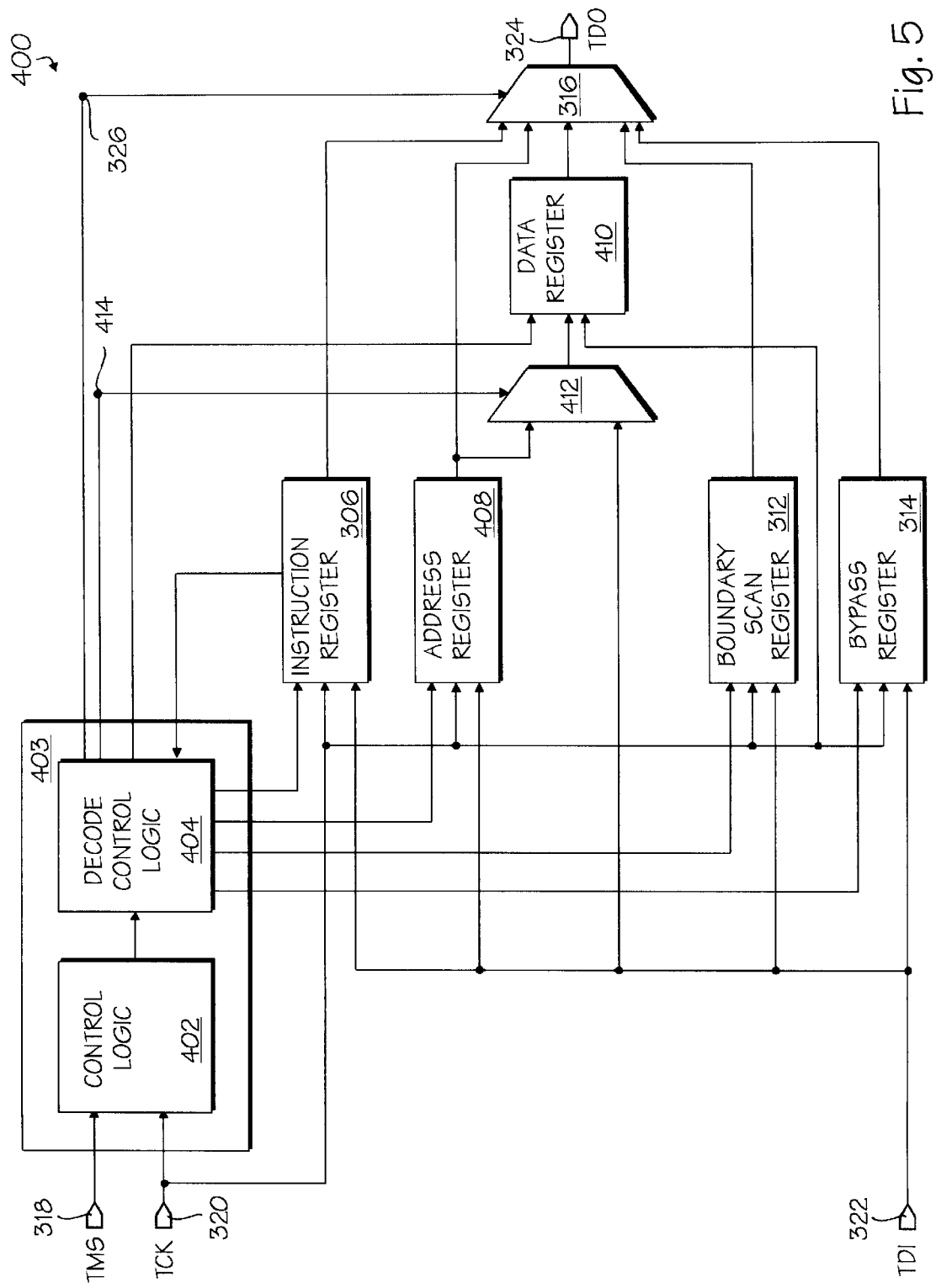
FIG. 5 illustrates a test circuit in which a second embodiment of the present invention may be implemented.

FIG. 5 discloses improved test logic 400 which is an improvement upon test logic 300, and in which the novel method described in FIG. 9 may be implemented. Unlike test logic 300 in FIG. 3, test logic 400 does not require both an address/data register and a data register comprising a total of X+2Y bits. Test logic 400 replaces address/data register 308 and data register 310 from FIG. 3, with address register 408 comprising X bits, data register 410 comprising Y bits and selector 412 which may be a 2-to-1 multiplexor. Test logic 400 is similar to the architecture disclosed in FIG. 8-2 of IEEE Std 1149.1 but which has not heretofore been utilized to implement the novel method described in FIG. 9 to reduce the number of method steps, instructions and clock cycles required to test a device.

As illustrated in FIG. 5, test logic 400 includes controller 403 which comprises control logic 402 coupled to decode control logic 404. Controller 403 functions in a similar manner as controller 303 illustrated in FIG. 4, however, controller 403 additionally works in conjunction with instruction register 306 to selectively control selector 412 via a select signal at node 414. Selector 412 receives data from address register 408 and TDI 322. In response to instruction register 306 and controller 403, the select signal at node 414 selectively enables either the data from address register 408 or TDI 322 to be passed through selector 412 to data register 410. Address register 408 is configured to receive TCK 320, input data TDI 322 and control signals from decode logic 404 and is configured to output data to selector 316. Additionally, data register 410 is also configured to receive control signals from decode control logic 404 and TCK 320, and is configured to output data to selector 316.

The novel method for testing a device described in FIG. 9 can be implemented in test logic 400 as described below. At step 900, an instruction is loaded into instruction register 306 which instructs test logic 400 in one instruction to load address information and a first packet. Additionally, this instructs controller 403 to generate the appropriate select signal at node 414 to selectively enable selector 412 to pass data from address register 408 to data register 410. At step 902, the first data packet and the address information are serially shifted into the device. The first data packet is serially shifted through address register 408, passed through selector 412, and stored in data register 410. The address information follows the first data packet and is serially shifted into address register 408. At step 904, an instruction is serially shifted into instruction register 306 which instructs test logic 400 to program the first data packet into an address location of the device under test defined by the address information stored in address register 408. At step 906, an instruction is serially shifted into instruction register 306 which instructs test logic 400 to read or capture a second data packet from the address location defined by the address information stored in address register 408. The captured second data packet is stored in data register 410. This step verifies that the first data packet was correctly programmed into the address location stored in address register 408. At step 908, the second data packet stored in data register 410 is serially shifted out of data register 410, through selector 316, and to TDO 324.

Once the second data packet has been serially shifted out of test logic 400 through TDO 324, it may be compared with the first data packet in order to verify that the first data packet was correctly programmed into the address location defined by the address information stored in address register 408. If the first and second data packets do not match, a second programming may be executed in order to verify the first comparison result. Rather than repeat every step in FIG. 9 as was required using test logic 300 described in FIG. 4, an instruction is serially shifted into instruction register 306 which instructs test logic 400 to load a third data packet into data register 410. This results in the selector signal at node 414 selectively enabling selector 412 to pass input data from TDI 322 to data register 410. A third data packet (which may be the equivalent of the first data packet) is then serially shifted into data register 410 through selector 412 without overwriting the address information already stored in address register 408.

As illustrated above, the method described in FIG. 9 may be implemented in test logic 400 while utilizing only five method steps, three instructions, and a total of only 3Z+2Y+X clock cycles in order to perform testing of a device. This is an appreciable reduction of Z clock cycles over the method illustrated in FIG. 8, and thus increases the testing throughput of the device or system, and decreases the likelihood of false errors occurring during the testing process due to undesired influences from system noise. Additionally, as described above with reference to FIG. 4, the present invention described in FIG. 5 may be implemented in test logic 400 configured to load and/or output data in parallel, or a combination of serial and parallel configurations.

Figure 6:
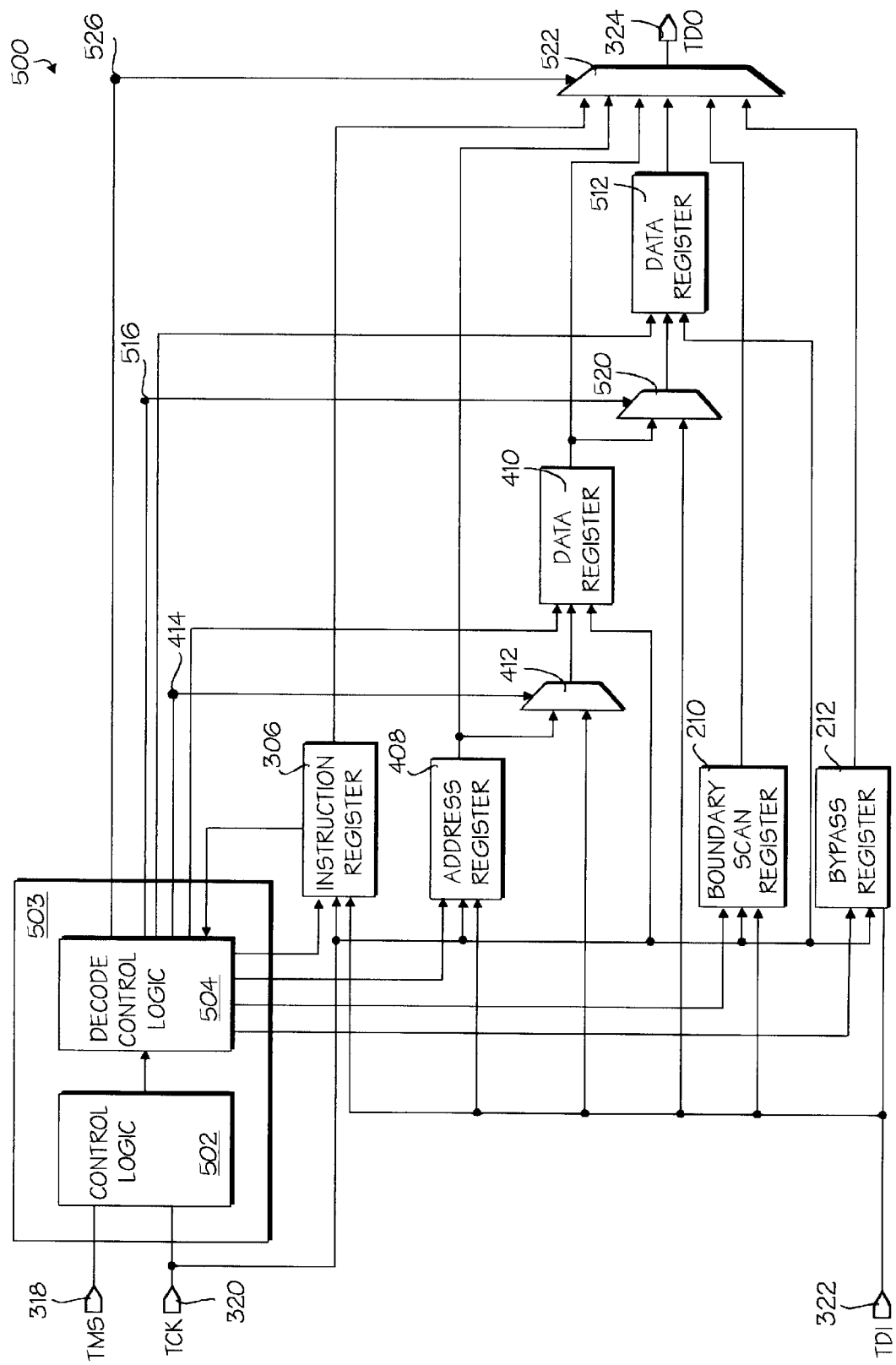
FIG. 6 illustrates a test circuit in which a third embodiment of the present invention may be implemented.

A novel test circuit for further implementing the method for testing a device described in FIG. 9 is illustrated in FIG. 6. FIG. 6 illustrates test logic 500 in which the method of FIG. 9 may be implemented. As illustrated in FIG. 6, test logic 500 includes controller 503 which comprises control logic 502 coupled to decode control logic 504. Controller 503 functions in a similar manner as controller 403 illustrated in FIG. 5, however, controller 503 additionally works in conjunction with instruction register 306 to selectively control selectors 412, 520 and 522 via select signals at node 414, 516 and 526 respectively. Selector 412, 520 and 522 may comprise multiplexors. Address register 408, data register 410 and data register 512 each additionally receive TDI 322, TCK 320 and decode control signals from decode logic 504 of controller 503. Selector 520 receives data from data register 410 and TDI 322. In response to instruction register 306 and controller 503, the select signal at node 516 selectively enables either the data from data register 510 or TDI 322 to be passed through selector 520 to data register 512. Selector 522, in response to a select signal at node 526, selectively enables which register outputs data to TDO 324. It will be appreciated test logic 500 may comprise any number of data registers like data register 410 and 512 each interconnected by a selector like selectors 412 and 520, and configured to receive control signals from controller 503 and input data from TDI 322.

The benefits of the reduced number of method steps, instructions and clock cycles described in the method of FIG. 9 are magnified when applied to test logic 500. At step 900, in one instruction test logic 500 is instructed to load address information into address register 408, and a first data packet into data registers 410 and/or 512. Additionally, step 900 instructs controller 503 to generate the appropriate select signals at nodes 414, 516 and 526 to selectively enable the first data packet to be passed through address register 408 and into data register 410 and 512. This may be a particularly useful design when the first data packet comprises subsets of data which might be individually manipulated when programming or reprogramming an address location in a device under test. For example, the first data packet may comprise a high byte and a low byte of data information. Additionally, data registers 410 and 512 may comprise different sizes. At step 902, for example, a low byte may be passed through address register 408 and data register 410 via selectors 412 and 520, and stored in data register 512. A high byte may likewise be passed through address register 408 via selector 412 and stored in data register 410. After an address location is programmed with the first data packet information in step 904, test logic 500 can be instructed to capture a second data packet from the address location at step 906. The second data packet could also comprise subsets of data, and is stored in data registers 410 and/or 512. Finally, at step 908, the second data packet may be output from data registers 410 and/or 512 through selector 522, which is controlled by a selector signal at node 526, to TDO 324.

Once the second data packet has been serially shifted out of test logic 500 through TDO 324, it may be compared with the first data packet in order to verify that the first data packet was correctly programmed into the address location defined by the address information stored in address register 408. If the first and second data packets do not match, a second programming may be undertaken in order to verify the first comparison result. Rather than repeat every step in FIG. 9 as was required using test logic 300 described in FIG. 4, an instruction is serially shifted into instruction register 306 which instructs test logic 500 to selectively load a third data packet into data register 410 and/or data register 512. The third data packet may be the equivalent of the first data packet. The third data packet, or a subset thereof, may be stored in data register 410 via selector 412 in response to the select signal generated by controller 503 at node 414. The third data packet may also comprise, for example, a high byte and low byte of data information. In a similar manner, the third data packet, or a subset thereof, may be stored in data register 512 via selector 520 in response to the select signal generated by controller 503 at node 516. The third data packet may be stored in either data register 410 and/or 512 without overwriting the address information already stored address register 408.

Assuming that instruction register 306 comprises Z bits, address register 408 comprises X bits and data registers 410 and 512 comprise Y bits each, the method of FIG. 9 as applied to test logic 500 could be implemented in 3Z+4Y+X clock cycles. That is, 3Z clock cycles to perform steps 900, 904 and 906, 4Y cycles clock to load data into and out of data registers 410 and 512 in steps 902 and 908, and X clock cycles to load address information into address register 408 at step 902. This is a reduction of as much as seven method steps, four instructions, and 4Z clock cycles over a conventional architecture, such as illustrated in FIG. 3, utilizing three data registers to store the associated address information and data packets. Additionally, as described above with reference to FIG. 4, the present invention described in FIG. 6 may be implemented in test logic 500 configured to load and/or output data in parallel, or a combination of serial and parallel configurations.

The architecture described in FIG. 6 can be further extended to include a data register, an address register, and any number of extra data and/or address registers interconnected by selectors or multiplexors. Such multitude of configurations could increase testing control and flexibility of the test architecture, while reducing the number of method steps, instructions and clock cycles required over conventional methods and architectures.

Figure 7:
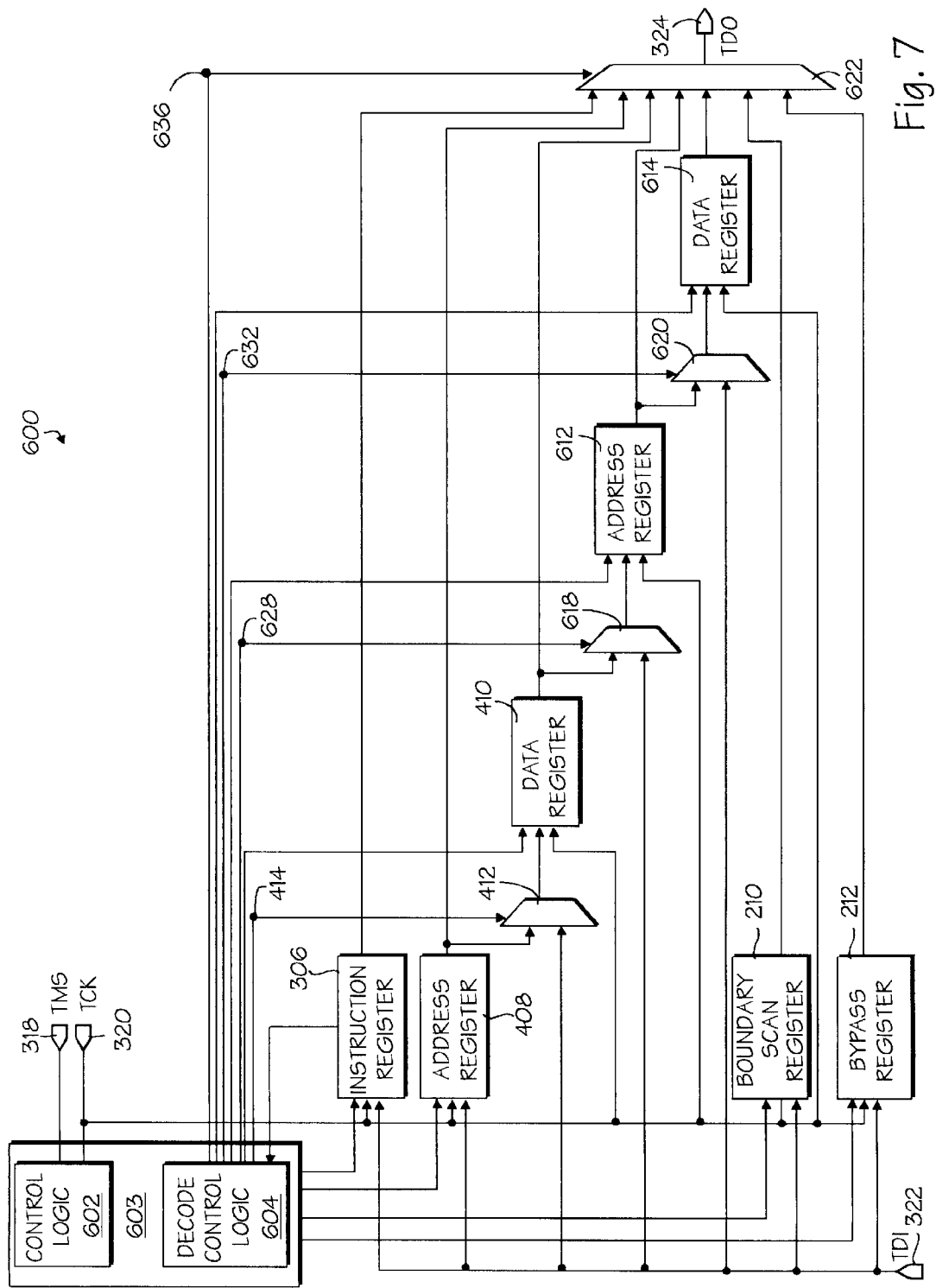
FIG. 7 illustrates a test circuit in which a fourth embodiment of the present invention may be implemented.

FIG. 7 illustrates an embodiment of the present invention utilizing two address registers and two data registers and which implements the novel method of FIG. 9. The multiple address registers may be utilized, for example, to store consecutive or subsequent address locations, or high and low bytes of address information, within the device under test in order optimize testing throughput.

As illustrated in FIG. 7, test logic 600 includes controller 603 which comprises control logic 602 coupled to decode control logic 604. Controller 603 functions in a similar manner as controller 403 illustrated in FIG. 6, however, controller 603 additionally works in conjunction with instruction register 306 to selectively control selector 618 via a select signal at node 628, selector 620 via a select signal at node 632, selector 622 via a select signal at nod 636, as well as, selector 412 via a select signal at node 414. Selector 618 receives data from data register 410 and input data TDI 322. In response to instruction register 306 and controller 603, the select signal at node 628 selectively enables either the data from data register 610 or TDI 322 to be passed through selector 618 to address register 612. Additionally, address register 612 is also configured to receive control signals from decode control logic 604 and TCK 320, and is configured to output data to selector 620. Selector 620 receives data from address register 612 and TDI 322. In response to instruction register 306 and controller 603, the select signal at node 632 selectively enables either the address information from address register 612 or the data from TDI 322 to be passed through selector 620 to data register 614. Data register 614 is configured to also receive control signals from decode control logic 604 and TCK 320, and is configured to output address information to selector 622. Additionally, in response to instruction register 306 and controller 603, the select signal at node 636 selectively enables either the data from any of the registers 306, 408, 410, 612 or 614 to be passed to TDO 324.

The method for testing a device illustrated in FIG. 9 may also be implemented in the architecture of FIG. 7. At step 900, in one instruction test logic 600 can be instructed to load address information, comprising a plurality of address data into address registers 408 and/or 612, and a first plurality of data packets into data registers 410 and/or 614. Address registers 408 and 612, as well as, data registers 410 and 614 may each comprise different sizes. Additionally, step 900 instructs controller 603 to generate the appropriate select signals at nodes 414, 628, 632 and 636 to selectively enable the first plurality of data packets to be passed through address registers 408 and 612 and into data register 410 and 614. At step 902, the first plurality of data packets are loaded into data registers 410 and 614 after passing through address registers 408 and 612 via selectors 412, 619 and 620. Also, at step 902, the plurality of address data is loaded into address registers 408 and 612. At step 904, the various address locations indicated by the plurality of address data stored in address registers 408 and 612 are programmed with the plurality of first data packets stored in data registers 410 and 614. The programming may occur simultaneously or in a series of programming steps. Alternatively, only one address location may be programmed with the data stored in either data register 410 or 614. Test logic 600 is then be instructed to capture a second plurality of data packets from the addressed locations at step 906. Alternatively, test logic 600 may capture only a subset of the second plurality of data packets. The second plurality of data packets would be stored in data registers 410 and/or 614. Finally, at step 908, the second plurality of data packet may be output from data registers 410 and/or 614 through selector 622 to TDO 324.

Once the plurality of second data packet has been serially shifted out of test logic 600 through TDO 324, it may be compared with the first plurality of data packets in order to verify that the first plurality of data packets was correctly programmed into the various address locations defined by the plurality of address data stored in address registers 408 and 612. If the first and second plurality of data packets do not match, a second programming may be undertaken in order to verify the first comparison result. Rather than repeat every step in FIG. 9 as was required using test logic 300 described in FIG. 4, an instruction is serially shifted into instruction register 306 which instructs test logic 600 to load a third plurality of data packets into either data register 410 and/or data register 614. The third plurality of data packets may be the equivalent of the first plurality of data packets. The third plurality of data packets may be stored in either data register 410 and/or data register 614 without overwriting the plurality of address data already stored in address registers 408 and 612.

As illustrated above with reference to FIGS. 4, 5 and 6 implementing the novel method described in FIG. 9, the novel test logic 600 illustrated in FIG. 7 significantly reduces, over the conventional test architecture of FIG. 3 and method of FIG. 8, the number of method steps, instructions and clock cycles required to test a device. Additionally, as described above with reference to FIG. 4, the present invention described in FIG. 7 may be implemented in test logic 600 configured to load and/or output data in parallel, or a combination of serial and parallel configurations.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for testing a device comprising:
   instructing said device to receive address information and a first data packet;
   loading said address information and said first data packet into said device, said first data packet selectively passed through a first storage element and a first multiplexor into a second storage element, said address information loaded into said first storage element;
   instructing said device to program said first data packet into an address location of said device defined by said address information;
   instructing said device to capture a second data packet from said address location;
   outputting said second data packet from said device;
   instructing said device to selectively receive a third data packet; and
   selectively loading said third data packet through said multiplexor into said second storage element without passing said third data packet through said first storage element.

2. The method of claim 1 wherein said device comprises an integrated circuit.

3. The method of claim 1 wherein said device comprises a plurality of integrated circuits.

4. The method of claim 1 further comprising:
   comparing said first data packet with said second data packet.

5. The method of claim 4 wherein said second data packet is stored in said second storage element.

6. The method of claim 1 wherein said third data packet is the equivalent of said first data packet.

7. The method of claim 1 wherein said address information and said data packet are serially shifted into said device.

8. The method of claim 1 wherein said address information and said data packet are loaded in parallel into said device.

9. A method for testing a device comprising:
   instructing said device to receive address information and a first data packet;
   loading said address information and said first data packet into said device, said first data packet selectively passed through an address storage element and a multiplexor into a plurality of data storage elements, said address information loaded into said address storage element;
   instructing said device to program said first data packet into an address location of said device defined by said address information;
   instructing said device to capture a second data packet from said address location, said second data packet stored in at least one of said plurality of data storage elements;
   outputting said second data packet from said device;
   instructing said device to selectively receive a third data packet; and
   loading said third data packet into at least one said plurality of data storage elements without passing said third data packet through said address storage element.

10. The method of claim 9 further comprising:
    comparing said first data packet with said second data packet.

11. The method of claim 9 wherein said third data packet is the equivalent said first data packet.

12. The method of claim 9 wherein said first data packet comprises a first plurality of data bits and a second plurality of data bits, wherein said plurality of data storage elements comprises a first and second storage element, said first storage element storing the first plurality of data bits of said first data packet, said second storage element storing the second plurality of data bits of said first data packet, wherein said first plurality of data bits is selectively passed through said second storage element and a second multiplexor into said first storage element.

13. The method of claim 12 wherein said second data packet comprises a third plurality of data bits and a fourth plurality of data bits, said third plurality of data bits stored in said first storage element, said fourth plurality of data bits stored in said second storage element.

14. A method for testing a device comprising:
    instructing said device to receive a plurality of address data and a first plurality of data packets;
    loading said plurality of address data and said first plurality of data packets into said device, said first plurality of data packets selectively passed through a plurality of address storage elements and a plurality of multiplexors into a plurality of data storage elements, said plurality of address data loaded into said plurality of address storage elements;
    instructing said device to program at least one of said first plurality of data packets into at least one of a plurality of address locations of said device defined by at least one of said plurality of address data;
    instructing said device to capture at least one of a second plurality of data packets from said at least one of said plurality of address locations, said at least one of said second plurality of data packets stored in at least one of said plurality of data storage elements;
    outputting said at least one of said second plurality of data packets from said device;

instructing said device to selectively receive at least one of a third plurality of data packets; and loading said at least one of said third plurality of data packets through at least one of said plurality of multiplexors into said plurality of data storage elements without passing said at least one of said third data packets through said plurality of address storage elements.

15. The method of claim 14 further comprising:

comparing said at least one of said first plurality of data packets with said at least one of said second plurality of data packets.

16. A testing circuit for a device comprising:

control logic for controlling the flow of address information and a first data packet received by said device;

an address storage element coupled to said control logic and for storing said address information;

a data storage element coupled to said control logic and for storing said first data packet;

at least one extra storage element coupled to said control logic and for storing either said address information or said first data packet; and a plurality of multiplexors coupled to said control logic, said address storage element, said data storage element, and said at least one extra storage element, said control logic selectively enabling said plurality of multiplexors to pass said first data packet through said address storage element and into said data storage element, said control logic selectively enabling said plurality of multiplexors to pass either said address information or said first data packet through said address storage element and said data storage element and into said at least one extra storage element, wherein said first data packet is programmed into an address location of said device defined by said address information, wherein said data storage element and/or said at least one extra storage element captures a second data packet from said address location, and wherein said second data packet is output from said device, said control logic configured to selectively load a second data packet through one of said plurality of multiplexors into the data storage element without passing said second data packet through said address storage element.

17. The testing circuit of claim 16 wherein said address information comprises a plurality of address data.

18. The testing circuit of claim 16 wherein said first data packet comprises a plurality of data.

19. The testing circuit of claim 16 further comprising an instruction register coupled to said control logic and for receiving and storing instructions for said testing circuit.

20. A method for testing a device comprising:

serially shifting a first instruction into a first register in said device, said first instruction configuring said device to receive address information and a first data packet;

serially shifting said first data packet through a multiplexor and into a data register in said device;

serially shifting said address information into an address register;

serially shifting a second instruction into the first register, said second instruction configuring said device to program said first data packet into an address location of said device defined by said address information;

serially shifting a third instruction into said device, said third instruction configuring said device to capture a second data packet from said address location;

outputting said second data packet from said device;

serially shifting a fourth instruction into the first register, said fourth instruction configuring said device to selectively receive a third data packet; and selectively loading said third data packet through said multiplexor into said data register without passing said third data packet through said address register.

\* \* \* \* \*